United States Patent [19]

Miyajima et al.

[11] 4,330,767

[45] May 18, 1982

[54] SURFACE ACOUSTIC WAVE DEVICE

[75] Inventors: Hajime Miyajima; Akio Nakakura, both of Sakado, Japan

[73] Assignee: Toko, Inc., Tokyo, Japan

[21] Appl. No.: 190,715

[22] Filed: Sep. 25, 1980

[30] Foreign Application Priority Data

Oct. 8, 1979 [JP] Japan .......................... 54/139420[U]

[51] Int. Cl.³ .................... H03H 9/25; H03H 9/64; H03H 9/145
[52] U.S. Cl. ................... 333/150; 333/154; 333/196
[58] Field of Search .................. 333/150–155, 333/193–196; 310/313 R, 313 A, 313 B, 313 C, 313 D, 365–366; 331/107 A

[56] References Cited

U.S. PATENT DOCUMENTS 3,845,419  10/1974  Nudd ................................. 333/154
3,979,702  9/1976  Hunsinger et al. ................. 333/196

Primary Examiner—Marvin L. Nussbaum

[57] ABSTRACT

A surface acoustic wave device is provided which includes a phase-modulated interdigital electrode and a uniform interdigital electrode having an equal electrode finger width and spacing, and the device is arranged to avoid occurrence of deviation of the actual performance thereof from the designed one. To this end, the electrode finger width and spacing of the uniform interdigital electrode are determined such that the ratio of metal surface to unmetallized substrate area in the phase-modulated interdigital electrode becomes equal to the ratio of metal surface to unmetallized substrate area in the uniform inter-digital electrode.

2 Claims, 4 Drawing Figures

SURFACE ACOUSTIC WAVE DEVICE

This invention relates to a surface acoustic wave device, and more particularly it pertains to interdigital electrodes for use with such a device.

A surface acoustic wave device is a device using interdigital electrodes as its input and output electrodes to thereby effect electro-mechanical signal conversion, and by virtue of its frequency characteristics and delay time characteristics, such a device has been employed as a signal processing device such as filter, delay line and so forth.

Conventional interdigital electrodes for use with a surface acoustic wave device are most commonly designed such that the electrode fingers thereof have an equal width and spacing (as viewed in the propagating direction of surface acoustic wave), the design being also made such that the width and spacing referred to above become equal to ¼ the wavelength of the surface acoustic wave. It has been found out, however, that interdigital electrodes of the foregoing construction which is uniform in respect of the width of and spacing between the respective electrode fingers cannot satisfactorily achieve desired frequency band characteristics; thus, various contrivances have heretofore been made in respect of designing such electrodes. Among such conventionally proposed contrivances is the amplitude-modulation procedure, which is referred to as weighting, wherein the opposing portions of electrode fingers having the same width are varied in term of length. It is a design procedure in which phase-modulation is resorted to that has recently become the object of attention, and in this procedure, electrode fingers are varied in terms of width so that the spacing between respective pulses in a pulse train can be determined as desired, thereby making the pulse train occur in conformity to the design.

Referring to FIG. 1, there is shown, in a schematic plan view, an example of surface acoustic wave device using interdigital electrodes which are phase-modulated as mentioned above. A piezoelectric substrate 10 is provided with a phase-modulated interdigital electrode 11 and a uniform interdigital electrode 12, with one of the two interdigital electrodes serving as an input electrode and the other as an output electrode.

The velocity of surface acoustic wave propagating through a surface of said substrate differs between on the surface of the substrate not covered with a metal and on the surface of a metal provided thereon. Thus difference occurs between the velocity at which surface acoustic wave propagates through the electrode units and that at which the surface acoustic wave propagates through portions where no such electrode units exist. Let it be assumed that in that region of each electrode which is surrounded by dotted lines in FIG. 1, the area of metal surface is represented by D and the area of the portion of the substrate surface where no metal surface exists is indicated by S. Thus, as shown in FIG. 2, the velocity of surface acoustic wave decreases as $D/(D+S)$ increases; for a change of 0.1 in $D/(D+S)$, the change in the velocity of surface acoustic wave, which depends on the material of the substrate/electrode, will generally be 1 to 6 m/sec. in the case of $LiNbO_3$, ZnO/glass, PZT or the like. From this, it will be seen that the velocity of surface acoustic wave becomes lower as the metal surface ratio increases.

Thus, with such a device as shown in FIG. 1, difference is caused to occur between the velocity at which surface acoustic wave propagates through the input electrode unit and that at which the surface elastic wave propagates through the output electrode unit, due to the fact that such velocity varies depending on the surface conditions. If the velocity of surface acoustic wave differs between the input and output electrodes, this will have adverse effect on the frequency characteristics of the device. More specifically, such difference will cause the center frequency to be deviated from the designed value, which will in turn result in the attenuation poles becoming deviated from the designed ones. This means that the device mentioned above with reference to FIG. 1 has such a drawback that when used as a filter, it can hardly achieve the desired filter characteristics.

Accordingly, it is an object of the present invention to provide an improved surface acoustic wave device capable of achieving any desired frequency characteristics, thereby eliminating the aforementioned drawback.

To achieve the foregoing object, the present invention is intended to provide a surface acoustic wave device which is so designed that surface acoustic wave is enabled to propagate at the same velocity through the input and output electrode units.

In the surface acoustic wave device according to the present invention, the area ratio of the surface portion of the substrate which is occupied by a metal surface relative to the unmetallized surface in the input electrode unit and that in the output electrode unit are made to be equal to each other, thereby enabling surface acoustic wave to be propagated at the same velocity through both the input and output electrode units.

Other objects, features and advantages of the present invention will become apparent from the ensuing description taken in conjunction with the accompanying drawings.

Figure 1:
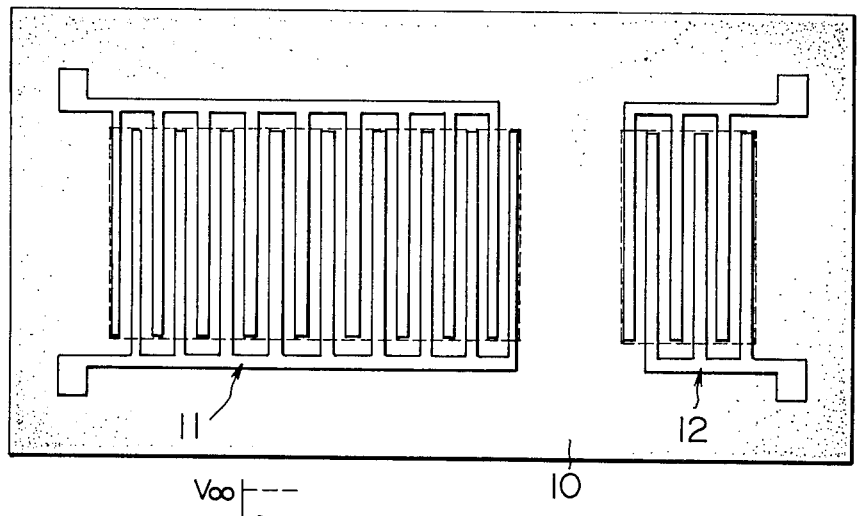
FIG. 1 is a top plan view showing the prior-art surface acoustic wave device.
Figure 2:
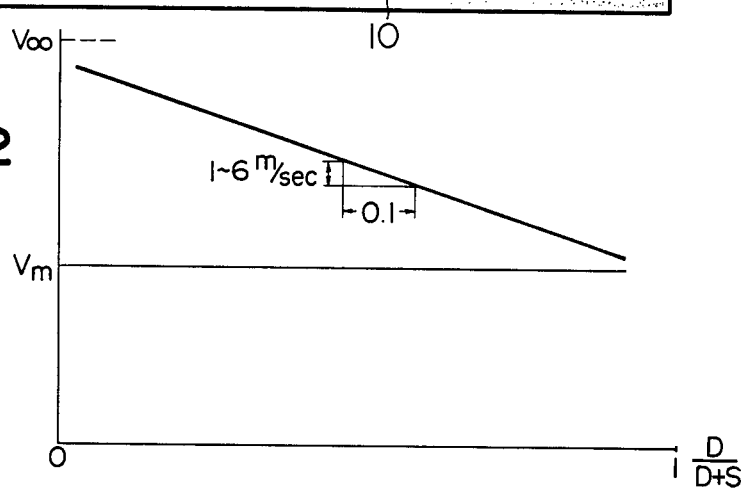
FIG. 2 is a view useful for explaining the relationship between the velocity of surface acoustic wave and the surface condition.
Figure 3A:
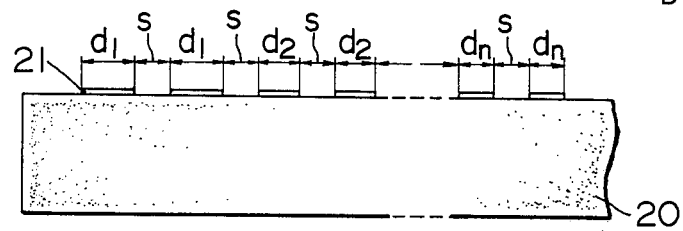
Figure 3B:
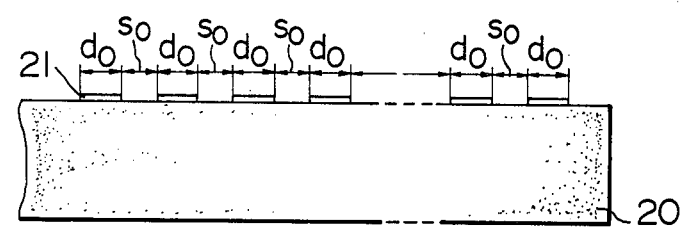

FIGS. 3(A) and 3(B) are partial front views showing the surface acoustic wave device according to an embodiment of this invention.

Referring to FIG. 3 of the drawings, there is shown, in a partial front view, the surface acoustic wave device according to an embodiment of this invention, FIG. 3(A) showing the portion of the device where a phase-modulated interdigital electrode is provided, FIG. 3(B) showing that portion of the device where a uniform interdigital electrode is provided. In each of these portions, a metal 21 such as gold, aluminum or the like is vapor-deposited on one surface of a substrate 20. The phase-modulated interdigital electrode shown in FIG. 3(A) is constructed such that each one electrode finger is divided into a pair of electrode finger elements having an equal width. It is the usual practice that the electrode fingers are all equally spaced apart from each other for the purpose of suppressing triple transient echo. The uniform interdigital electrode shown in FIG. 3(B) is constructed such that the electrode fingers all have an equal width and an equal spacing.

In the above-mentioned construction of the present invention, let it be assumed that the widths of the electrode finger elements of the phase-modulated interdigital electrode shown in FIG. 3(A) (each pair of electrode finger elements having an equal width) are $d_1$, $d_2$, ..., $d_n$ and that the spacing between the respective electrode finger elements is s. Then, the area ratio X of that portion of the substrate which is occupied by the metal surface in the electrode unit (relative to unmetallized surface), is given by the following equation:

$$X = \frac{2(d_1 + d_2 + \ldots + d_n)}{2(d_1 + d_2 + \ldots + d_n) + (2n - 1)s}$$

where n is an integer. In the uniform interdigital electrode shown in FIG. 3(B), let it be assumed that the width of each interdigital finger element is $d_0$ and that the spacing between the respective electrode finger element is $s_0$. Then, the area ratio Y of that portion of the substrate which is occupied by the metal surface in the electrode unit (relative to unmetallized surface), is given by the following equation:

$$Y = \frac{md_0}{md_0 + (m - 1)s_0}$$

where m is an integer. In the both electrode units, the electrode finger widths and spacings are adjusted so that the ratio in area of the metal surfaces become equal, or X=Y.

When the surface acoustic wave device is designed so as to meet the aforementioned requirements, the phase-modulated interdigital electrode is first designed in accordance with the desired pulse train, and the ratio of the width and spacing of each electrode finger of the uniform interdigital electrode is determined in accordance with the area ratio of the metal surface in the phase-modulated interdigital electrode unit which is determined from the designed electrode arrangement. In the case of the uniform interdigital electrode, if the number of electrode finger pairs is increased to some extent, then it may be considered that the ratio Y is approximately equal to $d_0/(d_0+s_0)$. Usually, the sum of the width and spacing is ½ the wavelength at the center frequency.

As will be appreciated from the foregoing discussion, in the surface acoustic wave device of this invention, the phase-modulated interdigital electrode can be designed as desired, and the uniform interdigital electrode may have the width and the spacing between the electrode fingers thereof determined based on the design of the phase-modulated interdigital electrode. In this way, according to the present invention, a surface acoustic wave device can be easily achieved which is of increased freedom of design and arranged to perform exactly as indicated by the design. It is to be understood that this invention is not limited to the foregoing embodiment but equally applicable to any device using a phase-modulated interdigital electrode.

What is claimed is:

1. A surface acoustic wave device including an input electrode and output electrode, each of said electrodes being formed of metal on a piezoelectric substrate, one of the input and output electrodes comprising a phase-modulated interdigital electrode, and the other comprising a uniform interdigital electrode with an equal electrode finger width and spacing, characterized in that the ratio of the metal surface area to the unmetallized surface area in said phase-modulated electrode is equal to the ratio of the metal surface area to the unmetallized surface area in said uniform interdigital electrode.

2. A surface acoustic wave device according to claim 1, wherein each of the electrode fingers of said phase-modulated interdigital electrode is divided into a pair of electrode finger elements having an equal width, and the spacing between adjacent electrode fingers and the spacing between each pair of divided electrode finger elements are all made to be equal.

* * * * *